United States Patent [19]
Mueller et al.

[11] Patent Number: 5,923,605
[45] Date of Patent: Jul. 13, 1999

[54] SPACE-EFFICIENT SEMICONDUCTOR MEMORY HAVING HIERARCHICAL COLUMN SELECT LINE ARCHITECTURE

[75] Inventors: Gerhard Mueller, Wappingers Falls, N.Y.; Heinz Hoenigschmid, Starnberg, Germany

[73] Assignee: Siemens Aktiengesellschaft, Munich, Germany

[21] Appl. No.: 08/940,861

[22] Filed: Sep. 29, 1997

[51] Int. Cl.⁶ ........................................... G11C 8/00
[52] U.S. Cl. ..................... 365/230.03; 365/230.06; 365/63; 365/51
[58] Field of Search ............... 365/230.03, 230.06, 365/63, 51, 149

[56] References Cited

U.S. PATENT DOCUMENTS

5,499,215  3/1996  Hatta ................................. 365/230.03
5,715,209  2/1998  Yoo .................................... 365/230.03
5,822,268  10/1998  Kirihata ............................ 365/130.03

*Primary Examiner*—Huan Hoang
*Attorney, Agent, or Firm*—Stanton C. Braden

[57] ABSTRACT

Disclosed is a multiple bank semiconductor memory (40) (e.g., DRAM) capable of overlapping write/read operation to/from memory cells of different banks (MAa, MAb), and having a space efficient layout. Chip size is kept small by employing a single column decoder (44) for different banks, and a hierarchical column select line architecture, with bit line switches (59, 61, 63, 65) of different columns having a shared active area such as a common source region. In an illustrative embodiment, global column select lines ($GCSL_1$-$GCSL_{(N/K)}$) selectively activate global bit line switches (67, 68) which are coupled to bank-specific data lines (LDQ, $\overline{LDQ}$). Several bank bit line switches (59–66) are coupled to each global bit line switch, with two or more bank bit line switches of different columns having a shared diffusion region to realize a compact layout.

20 Claims, 8 Drawing Sheets

SPACE-EFFICIENT SEMICONDUCTOR MEMORY HAVING HIERARCHICAL COLUMN SELECT LINE ARCHITECTURE

FIELD OF THE INVENTION

The present invention relates generally to semiconductor memories such as dynamic random access memories (DRAMs). More specifically, this invention relates to a multi-bank semiconductor memory having a hierarchical architecture for column select lines and data lines.

BACKGROUND OF THE INVENTION

Contemporary high density DRAMs typically employ several memory subarrays on the chip, where each subarray is associated with a sense amplifier bank for amplifying the signals stored in the respective cells. At the present time, most, if not all, commercially available DRAMs are incapable of performing read and write operations to/from the different subarrays of a common unit on the chip in overlapping time intervals. Such capability would be desirable in order to increase the overall speed of information storage and retrieval to/from the chip.

Figure 1:
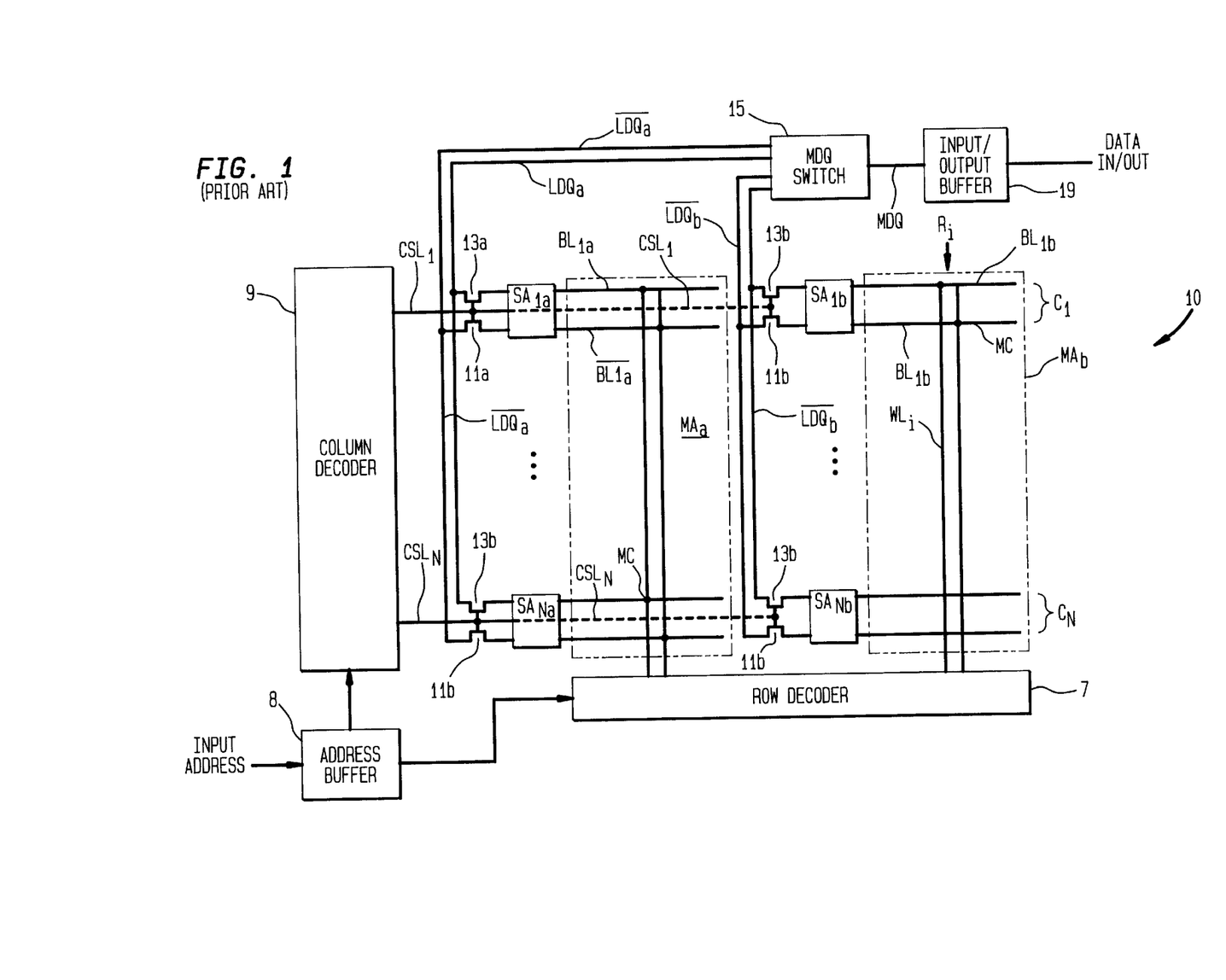
FIGS. 1 and 2 illustrate prior art DRAM configurations.

FIG. 1 is a simplified block diagram and layout of one conventional multi-subarray DRAM architecture. DRAM 10 employs a single column decoder 9 in conjunction with two memory cell subarrays MAa and MAb. While only two subarrays are shown for clarity of illustration, state of the art DRAMs typically utilize four or more subarrays. A subarray is associated with a sense amplifier bank. Input addresses are applied to an address buffer 8, which splits up each address into a column address supplied to column decoder 9 and a row address supplied to row decoder 7. Based on the column address, e.g., an eight bit address, column decoder 9 activates one of N column select lines, $CSL_1$-$CSL_N$, each corresponding to a common column of both subarrays MAa and MAb. Each column select line such as CSL, is applied to the gates of a pair of FET bit line switches, e.g. 11a and 13a in column $C_1$ of MAa. Column select line $CSL_1$ extends across MAa and connects to the gates of FET bit switches 11a and 13b in column $C_1$ of subarray MAb. Extension across the subarray MAa is typically facilitated by fabricating the column select lines in a different vertical layer than the bit lines. Based on the row address, one of the word lines $WL_i$ is activated to turn on the access transistors within the memory cells MC in the corresponding row $R_i$.

The configuration shown in FIG. 1 is known as a folded bit line configuration, which employs bit line pairs of true and complementary bit lines running side by side on the same side of the associated sense amplifier. Bit switches such as 13a and 11a have their sources connected to corresponding true and complementary bit lines $BL_{1a}$ and $\overline{BL_{1a}}$, respectively, of the corresponding column. Each one of N sense amplifiers for each subarray, e.g. $SA_{1a}$ to $SAN_{Na}$ for array MAa, amplifies a differential voltage between the true and complementary bit lines of the corresponding column during a read operation. A true local data line $\overline{LDQa}$ connects to the drains of each bit switch 13a in bank MAa. A complementary local data line $\overline{LDQa}$ connects to the drains of each bit switch 11a. Local data lines LDQb and $\overline{LDQb}$ are similarly connected to associated bit switches. Although not specifically shown in FIG. 1, each sense amplifier is typically connected to multiplex switches on both sides of the sense amplifier to thereby provide a "shared" configuration in which cell signals on both sides of the sense amplifier are amplified. If an "open" bit line configuration were used, the true and complementary bit lines of a pair would run on opposite sides of each sense amplifier.

A master data line (MDQ) switch 15 is employed to switch between subarrays and select one subarray at a time to access cells (write or read data to or from cells). The MDQ switch includes suitable logic circuitry which receives the row address from address buffer 8 to determine which array to select. Based on the row address and other control signals, array select switch 15 selects one of the local data lines for memory cell access and switches the data to/from that line from/to a master data line MDQ. An input/output buffer 19 acts as a buffer between the MDQ line and external data lines connected to the DRAM.

In the configuration of FIG. 1, if a read or write is performed for one of the subarrays, and is immediately followed by a read or write from/to one of the other subarrays, a substantial time interval is necessary to separate the two operations to avoid data corruption. More specifically, in order to write to a cell in a column of subarray MAa, the corresponding column select line has to be activated (high), turning the bit switches on. On the other hand, at the start of sensing during a read operation from a cell in subarray MAb, the bit lines must be precharged for a predetermined time just prior to a read. Therefore, all of the bit switches connected to the bit lines of MAb need to be low. Thus, to avoid data corruption, the precharge operation for subarray MAb needs to be started after the read or write is completed for MAa. Hence, the time period separating the actual reading and writing is substantial, e.g., on the order of 60 ns or more, thus slowing down overall memory access speed.

Figure 2:
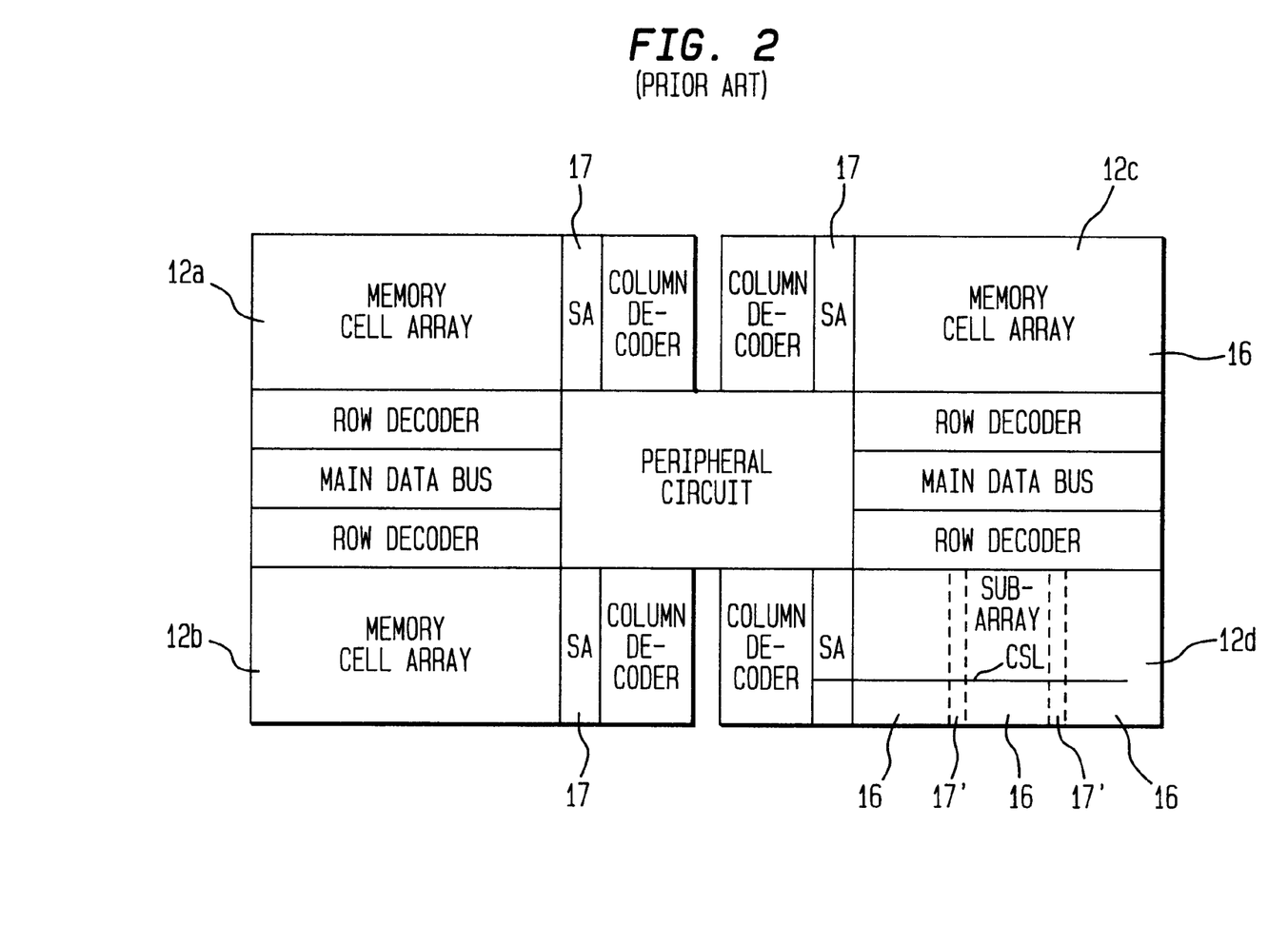

FIG. 2 shows a prior art multi-bank DRAM configuration which allows independent operation of each memory bank. (Herein, the term "bank" refers to a memory array which can essentially be operated independently, i.e. written into while another bank is read from, and vice versa). Banks 12a–12d are each disposed adjacent a separate row decoder and each have their associated sense amplifier bank 17 situated adjacent a respective column decoder. A main data bus runs in between the upper and lower row decoders on each side, and peripheral circuitry resides in the center of the chip. Each memory bank such as 12d may be split up into several subarrays 16 by using additional sense amplifier banks 17' adjacent the respective subarrays 16, and running the column select lines CSL from the column decoder to the bit switches associated with each subarray, as was described in reference to FIG. 1. In any case, a drawback of the DRAM configuration of FIG.2 is that the additional column decoders employed for the different banks occupy substantial space on the chip, thereby significantly increasing chip size for a given number of memory cells.

Accordingly, there is a need for a multi-bank semiconductor memory architecture which permits substantially independent access of the various banks without significantly increasing the size of the overall chip.

SUMMARY

The present disclosure is directed towards a multiple bank semiconductor memory (e.g., DRAM) capable of overlapping write/read operations to/from memory cells of different banks, and having a space efficient layout. Chip size is kept small by employing a single column decoder for different banks, and a hierarchical column select line architecture where bit line switches of different columns have a shared active area such as a common source or drain region.

In an exemplary embodiment of the invention, a semiconductor memory of the present invention includes a plurality of memory cell banks, each having a plurality of rows and columns, with bit lines running in the respective columns to access memory cells therein. A column decoder is operative to selectively activate at least one of a plurality of global column select lines in accordance with a column address. Each global column select line controls at least one global bit line switch of a memory cell bank, where each global bit line switch is coupled to a data line for the associated memory cell bank. A plurality of bank bit line switches are coupled to each global bit line switch, with each bank bit line switch coupled to a bit line of an associated column. The bit lines are selectively activated in accordance with the column address such that a bit line of a particular column is activated when both a global bit line switch and a bank bit line switch associated with that column are activated. At least one bank bit line switch has a shared diffusion region, e.g., a common source or drain region, with at least one of another bank bit line switch or a global bit line switch. In one embodiment, four bank bit line switches of different columns and one global bit line switch have a common active area (diffusion region) to provide a space-efficient layout.

BRIEF DESCRIPTION OF THE DRAWINGS

Preferred embodiments of the present invention will now be described in reference to the drawings, in which like reference numerals depict similar or identical features throughout the several drawings, wherein.

DETAILED DESCRIPTION OF THE INVENTION

The present invention relates to a multiple bank semiconductor memory capable of overlapping write/read operations to/from memory cells of different banks, and having a space efficient layout. The invention employs a hierarchical column select line architecture and active area sharing among bit line switches to achieve a compact layout for a multi-bank memory. For purposes of discussion, an exemplary embodiment of the invention is described in the context of a DRAM chip. The invention however has broader applications. Merely by way of example, the invention has application in other memory devices such as EDO-DRAM, SDRAM, RAMBUS-DRAM, MDRAM, SRAM, flash RAM, EPROM, EEPROM, mask ROM, or merged DRAM-logic (embedded DRAM). The devices are used in, for example, consumer products such as computer systems, cellular phones, personal digital assistants (PDAs), and other electronic products.

Figure 3:
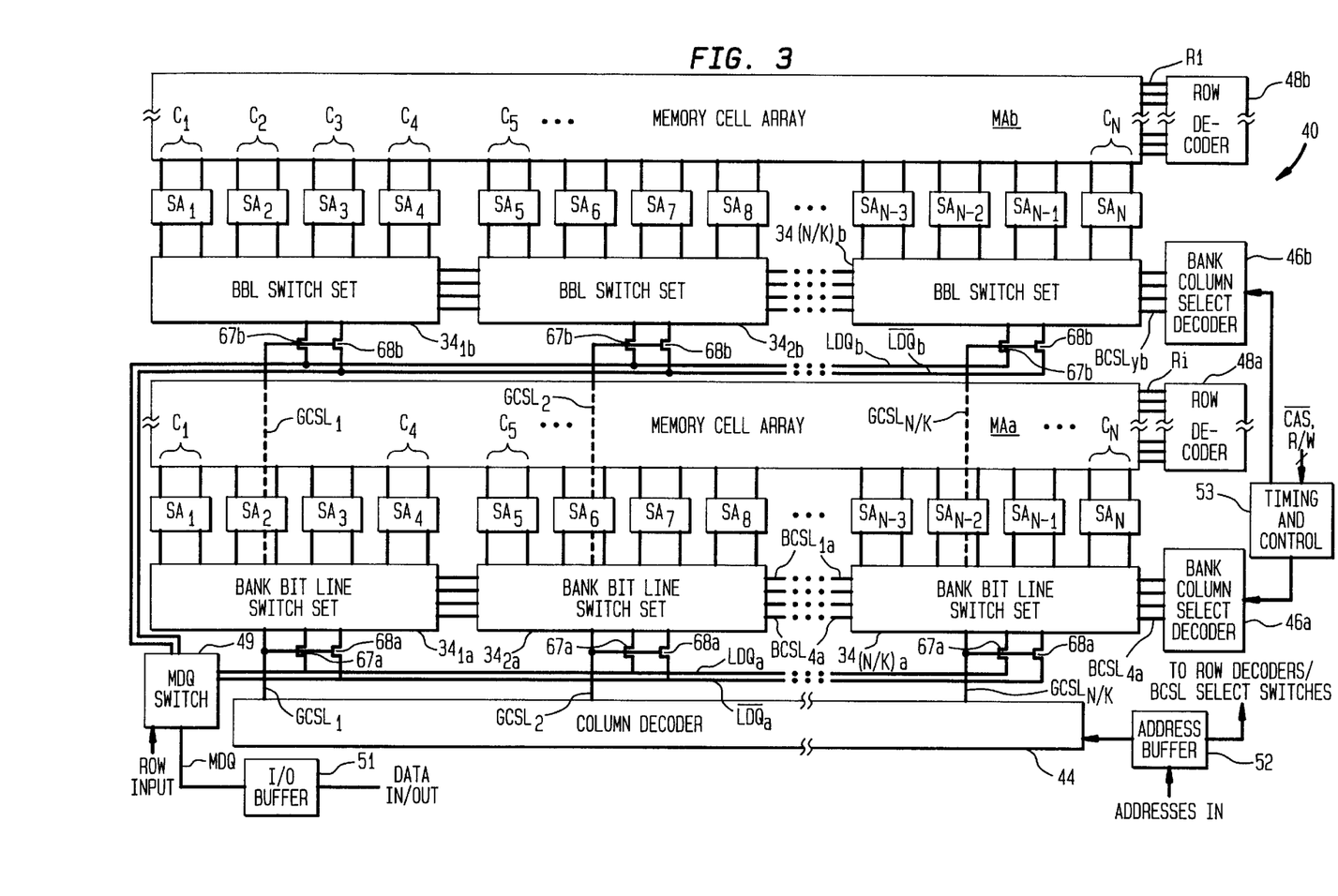
FIG. 3 is a schematic block diagram of an exemplary embodiment of the invention.

With reference now to FIG. 3, a first embodiment of the present invention, DRAM 40, is schematically illustrated. DRAM 40 utilizes a single column decoder 44 for at least two memory cell arrays (banks) MAa and MAb. While only two memory cell banks are shown, column decoder 44 is typically used for four or more banks. Each memory cell bank MAa, MAb has memory cells arranged in N columns by M rows, where N and M are each typically a large number. The N columns of each memory cell bank are connected to N respective sense amplifiers $SA_1$ to $SA_N$, each of which amplifies a voltage level read from a selected memory cell in the column in a conventional manner.

Incoming addresses are applied to an address buffer 52 which splits up each address into a column address and a row address. The column address is applied both to column decoder 44 and to bank column select decoders 46a and 46b for banks MAa and MAb, respectively. In response to the incoming address, column decoder 44 activates a corresponding one of N/K global column select lines $GCSL_1$, to $GCSL_{N/K}$, where K is an integer greater than one. In the embodiment of FIG. 3, K equals four. Each global column select line is associated with four columns in this example. For instance, if the input column address corresponds to any one of columns $C_1$ to $C_4$, only global column select line $GCSL_1$ would be activated. If the column address corresponds to any one of columns $C_5$–$C_8$, only $GCSL_2$ would be activated, and so forth. Data to/from the memory cell corresponding to the incoming address is provided on the associated local data line LDQ or $\overline{LDQ}$. MDQ switch 49 is responsive to a row input signal to switch the data on a selected local data line to a master data line MDQ, which is connected to a conventional input/output buffer 51 for data transfer to/from the DRAM.

It is noted that while the bank column select (BCS) decoders 46a, 46b are shown in FIG. 3 as separate from column decoder 44, they are preferably integrated with column decoder 44. As an alternative, the DRAM may utilize only a single BCS decoder for all of the memory banks MAa, MAb, etc. In this case, the same corresponding BCSL line is activated for each bank. For example, if line $BCSL_{4a}$ of bank MAa is activated, then line $BCSL_{4b}$ of bank MAb would be activated, and so forth.

Figure 4A:
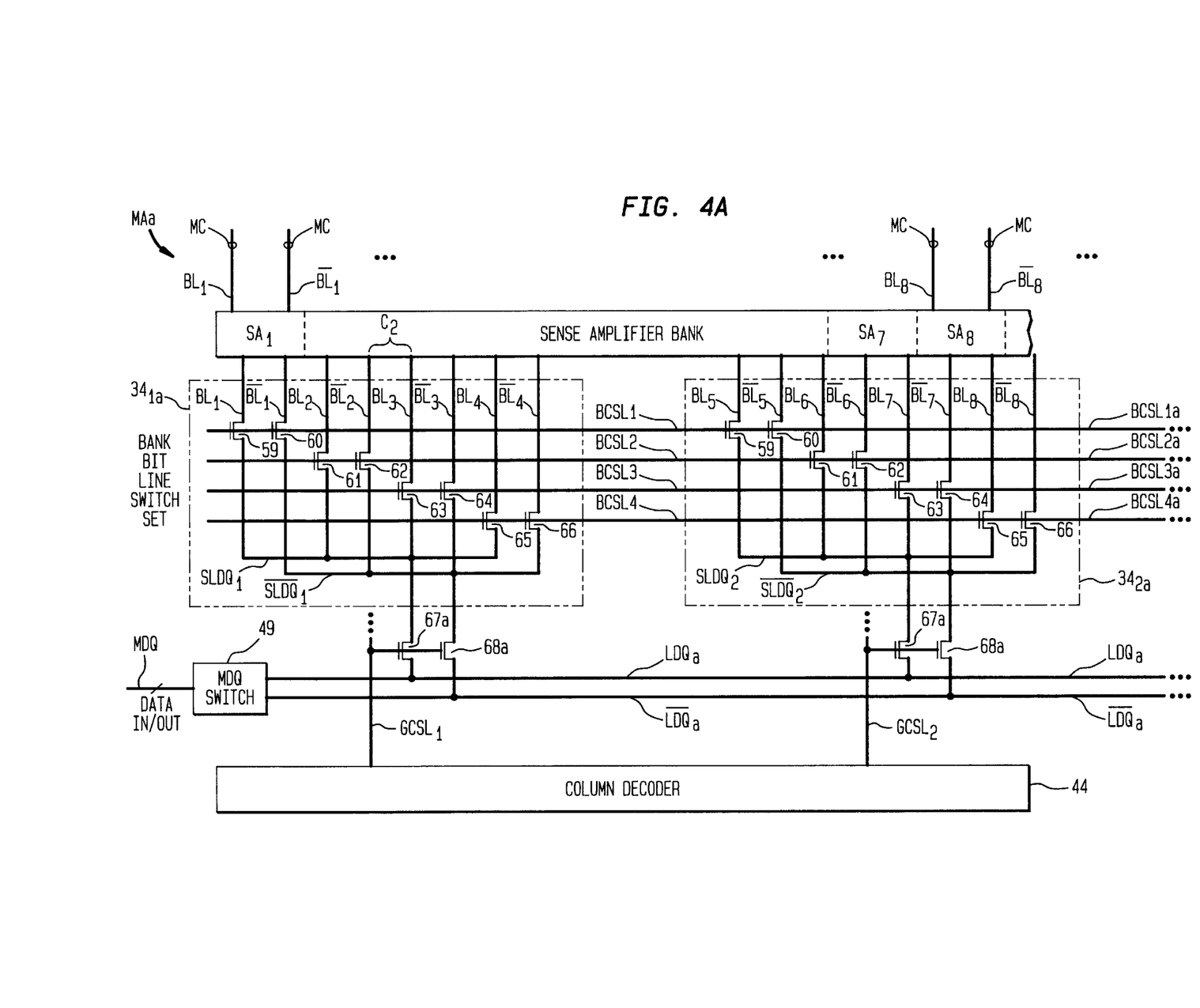
FIG. 4A illustrates a circuit diagram including global and bank bit line switches of the embodiment of FIG. 3.

FIG. 4A is a schematic of a part of DRAM 40 illustrating the hierarchical bit line and hierarchical local data line arrangements. Referring collectively to FIGS. 3 and 4A, each global column select line such as $GCSL_1$ connects to the gates of a pair of global bit line switches 67a and 68a for memory cell array MAa. Global line $GCSL_1$ also connects to the gates of switches 67b and 68b of bank MAb. Global bit line switches 67a, 68a are coupled to a bank bit line (BBL) switch set $34_{1a}$ of bank MAa; switches 67b, 68b are coupled to BBL switch set $34_{1b}$ of bank MAb, and so forth.

Global bit line switch 67a has its source coupled to local data line LDQa of memory array MAa, and its drain coupled to a sub local data line $SLDQ_1$. Sub local data line $SLDQ_1$ is coupled to the sources of bank bit line switches 59, 61, 63 and 65, which have their drains coupled to true bit lines $BL_1$ to $BL_4$, respectively. The gates of bank bit line switches 59, 61, 63 and 65 are coupled to bank column select lines $BCSL_{1a}$ to $BCSL_{4a}$, respectively. Thus, in order to read or write from the true memory cells of column $C_2$, for example, global line $GCSL_1$ is activated, thus closing switch 67a, and bank column select line $BCSL_{2a}$ is activated, thereby closing bank bit line switches 61 and 62. The data on bit line $BL_2$ is then transferred through switches 61 and 67a to local data line LDQa during a read operation, and vice versa for a write.

In the above example, while data is being read from a particular memory cell of column $C_2$ and row $R_i$ in memory cell bank MAa, a write or read operation can be commenced for a memory cell in column $C_2$ (or a different column) and row Rj of bank MAb. A different row address may be supplied to row decoder 48a of MAa than to row decoder 48b of MAb. An input R/W signal or signals applied to timing and control circuit 53 controls which bank is to be read from and which is to be written to. If a read from bank MAa and an overlapping write into bank MAb are to be performed, data corruption is prevented by offsetting the timing signals driving the bank bit line switches in bank MAa relative to bank MAb. That is, bank column select switches 46a and 46b activate the bank bit line switches in the respective banks at different times.

Figure 5:
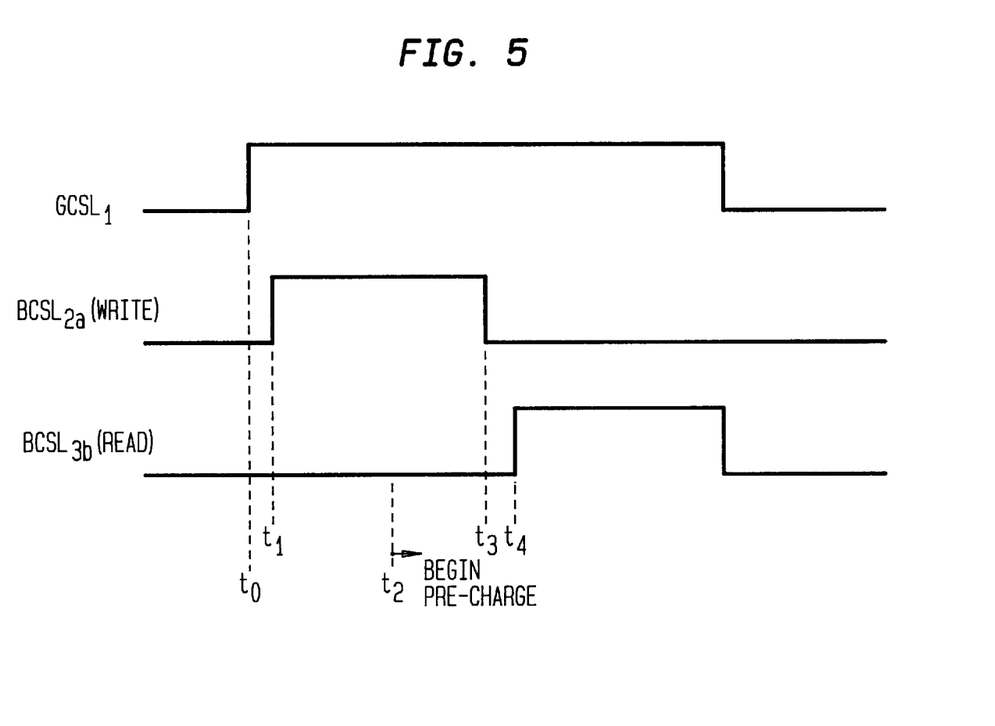
FIG. 5 is a timing diagram illustrating different bit line switch timings for read and write operations.

An example of this offset timing approach is illustrated in FIG. 5. In this example, data is written into a memory cell in column $C_2$ of bank MAa while an overlapping read is performed from column $C_3$ of bank MAb. At time $t_0$, the $GCSL_1$ line is raised. At time $t_1$, e.g., several nanoseconds after $t_0$ the $BCSL_{2a}$ line is brought high, turning on bank bit line switches 61 and 62 to permit data to be written into a cell in column $C_2$. While data is being written into bank MAa between times $t_1$ and $t_3$, a precharge operation is commenced at time $t_2$ for the bit lines of column $C_3$ by disabling the associated sense amplifier $SA_3$ and activating the equalization circuit for that column. Thus, at the end of the write operation at time $t_3$, the necessary precharge time has elapsed, so that the actual data can be read from the selected cell in column $C_3$ of MAb at time $t_4$. The time interval between times $t_3$ and $t_4$ is thus very short, e.g., about 15 nanoseconds. In prior art architectures such as that shown in FIG. 1, the time separating read and write operations of different subarrays is substantially longer, e.g., about 60 nanoseconds.

Figure 4B:
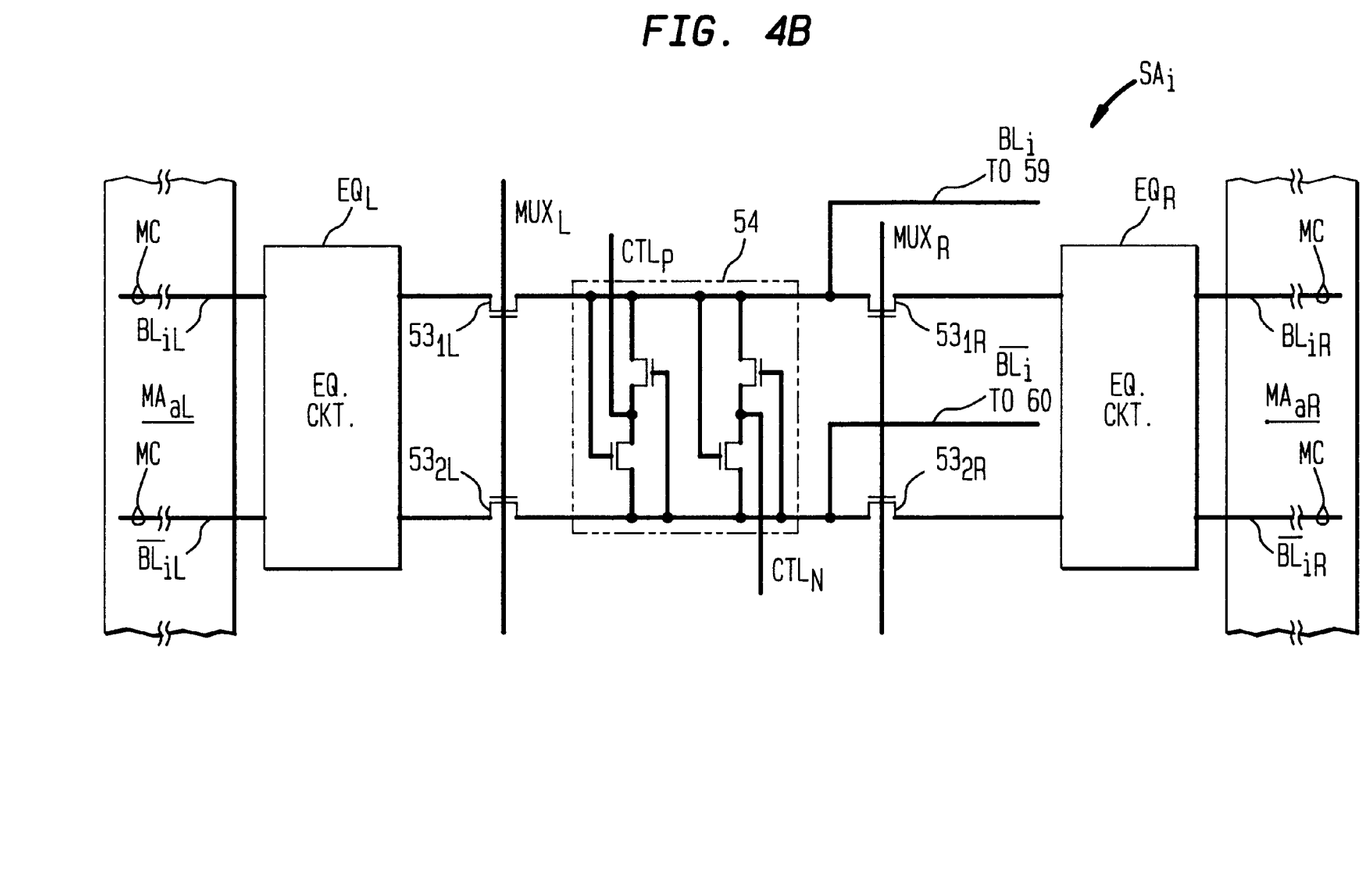
FIG. 4B illustrates an embodiment of the present invention employing a folded bit line architecture.

The DRAM 40 in FIG. 3 is shown for clarity as having a folded bit line architecture with unshared sense amplifiers. However, a shared sense amplifier configuration is preferable, as shown in FIG. 4B. In the shared configuration, each sense amplifier $SA_i$ is used for reading and refresh operations to memory cells located on both sides of the sense amplifier. Thus, for example, memory bank MAa would consist of a left array $MA_{aL}$ and a right array $MA_{aR}$ on respective left and right sides of the sense amplifier bank. On each side of latch circuit 54 there resides a pair of multiplex switches $53_{1L}$, $53_{2L}$ or $53_{1R}$, $53_{2R}$ to select the left or right sides of the bank in response to control signals $MUX_L$ or $MUX_R$. A control signal $CTL_P$, controls the P-latch portion of latch 54 while control signal $CTL_N$ controls the N-latch. Equalization circuits $EQ_L$ and $EQ_R$ are coupled between the MUX switches 53 and the respective left and right sides of the memory bank. Memory cells MC in column $C_i$ are accessed via bit line $BL_{iL}$ or $\overline{BL_{iL}}$ in array $MA_{aL}$, or via bit line $BL_{iR}$ or $\overline{BL_{iR}}$ in array $MA_{aR}$. The drains of the associated bank column select switches such as 59 and 61 are connected to the circuit nodes of the latch circuit 54 in between the MUX switches. Preferably, the bank and global column select switches are disposed in a different vertical layer than the sense amplifiers.

Figure 4C:
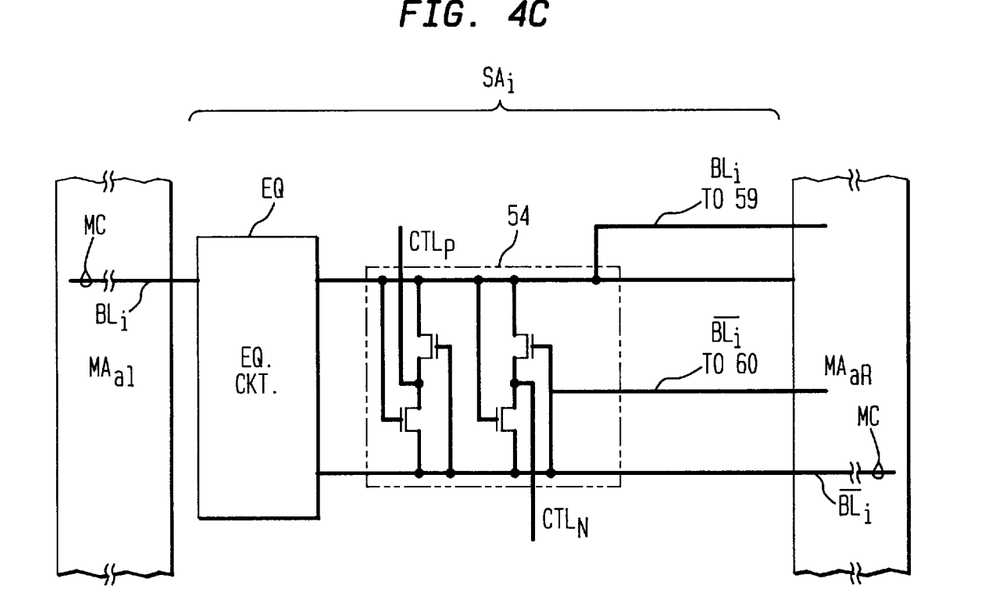
FIG. 4C illustrates an embodiment of the present invention employing an open bit line architecture.

In an alternative embodiment, DRAM 40 uses an open bit line architecture, as shown in FIG. 4C. For this case, the bit line pairs $BL_i$, $\overline{BL_i}$ extend on opposite sides of the sense amplifier $SA_i$. Only one equalization circuit EQ is necessary for the open configuration. As in the folded configuration, the drains of the bank column select switches such as 59 and 61 connect to opposite circuit nodes of the latch 54.

The present invention is also applicable to memory cell arrays with sense amplifiers using reference cells, such as in flash RAM. In this case, the bit lines are not arranged in true and complementary pairs. Rather, the reference cell within the sense amplifier provides the equalization (reference) voltage that the complementary line would otherwise provide (when accessing cells coupled to the true cells) or that the true bit line would otherwise provide (when accessing cells coupled to the complementary bit lines). The bank bit line switches would be connected to opposite sides of the latch 54 for this case as well.

Figure 6:
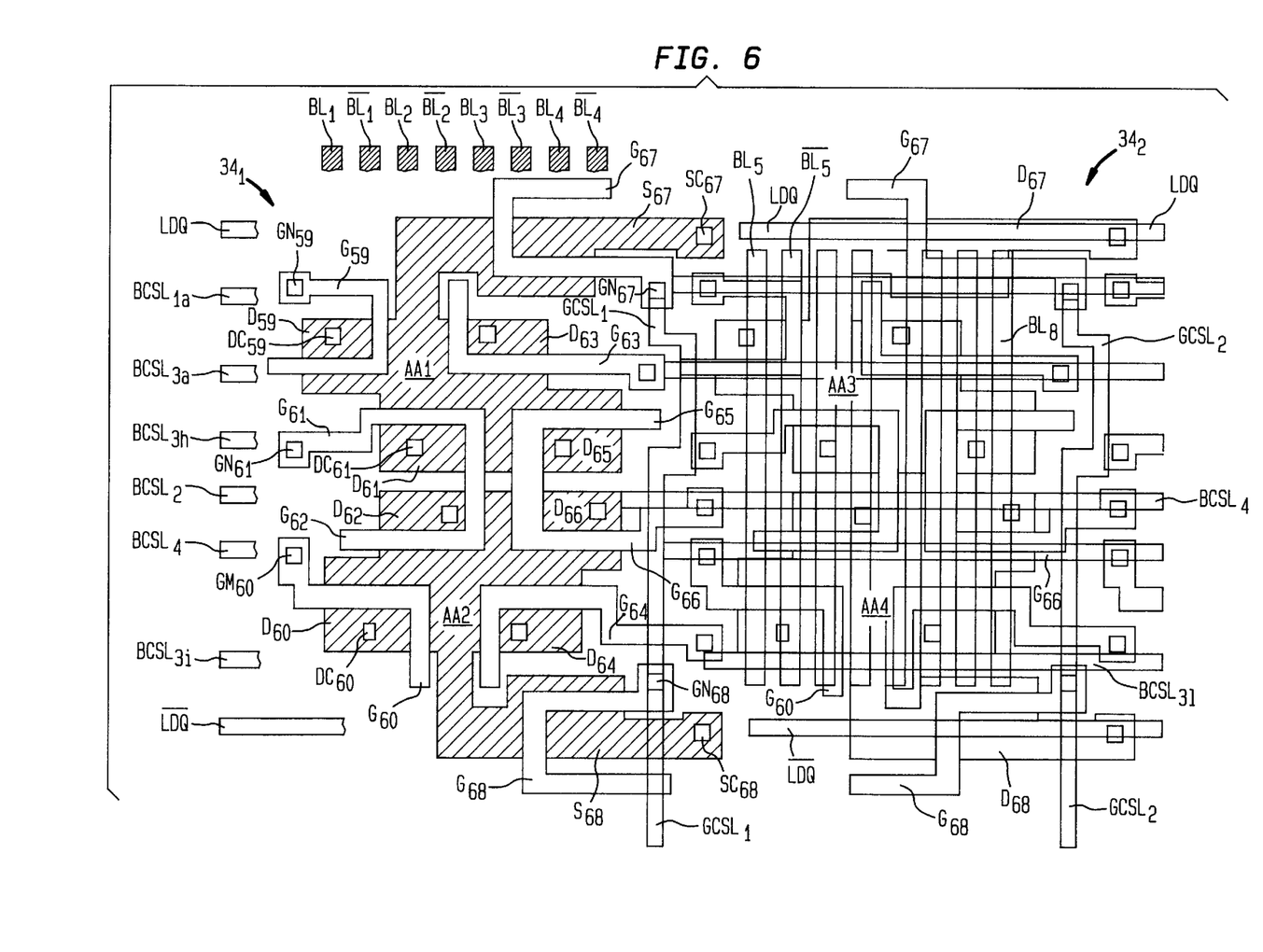
FIG. 6 shows a layout in accordance with the invention corresponding to the embodiment of FIG. 4.

Turning now to FIG. 6, there is shown a plan view of an exemplary layout for the bank bit line switches, the global bit line switches, and the bank and global column select lines, for the hierarchical circuit configuration of FIGS. 3 and 4(A–C). An important feature of the layout is the active area (AA) sharing between several bit line transistors. The term "active area" as used herein, refers to doped diffusion regions and encompasses source, drain and channel regions of a field effect transistor. The active area sharing allows for a highly compact design which thereby enables the hierarchical architecture to be implemented with low or minimal area penalty. Preferably, active area is shared among all "true" bit line switches of each bank bit line switch set $34_i$ and the associated global bit line transistor 67 for the set. Active area is also preferably shared among all "complementary" bit line switches of each switch set $34_i$ and the associated global bit line transistor 68 for that set.

In FIG. 6, the transistor regions of bank bit line switch set $34_1$ are shown for clarity with the bit lines $BL_1$–$BL_4$ and bank column select lines $BCSL_1$–$BCSL_4$ removed and with the local data lines LDQ and $\overline{LDQ}$ removed. For bit line switch set $34_2$ associated with columns $C_5$–$C_8$, the bit lines and column select lines are shown superimposed with the transistor regions. The layout of each bit line switch set $34_1$–$34_{(N/K)}$ is essentially the same.

For bank bit line switch set $34_1$, active area AA1 is shared among bank bit line transistors 59, 61, 63 and 65, each of which has its drain coupled to a true bank bit line $BL_1$, $BL_2$, $BL_3$ and $BL_4$, respectively. Active area AA1 is also shared with global bit line transistor 67. In the layout, the gate conductor of a transistor with legend "ii" is designated as $G_{ii}$, the drain region is designated as $D_{ii}$, the electrical contact from bit line to drain is designated as $DC_{ii}$, and the electrical contact from a bank column select line to the gate conductor of transistor "ii" is designated as $GN_{ii}$. Each drain region has a drain to bit line contact, e.g., contact $DC_{61}$ for device 61. For example, the portion of active area $AA_1$, adjacent the U-shaped gate conductor $G_{59}$ is the source region of transistor 59, and the region on the other side of gate $G_{59}$, designated as $D_{59}$, is the drain region of device 59. Contact $GN_{59}$ connects gate $G_{59}$ to bank column select switch $BCSL_1$; drain contact $DC_{59}$ connects drain region $D_{59}$ to bit line $BL_1$, and so forth. All connections correspond to the schematic diagram of FIG. 4A. The active area $AA_1$ is the equivalent of the sub local data line $SLDQ_1$ of FIG. 4A; $AA_2$ corresponds to $\overline{SLDQ_1}$; $AA_3$ corresponds to $SLDQ_2$; and $AA_4$ corresponds to $\overline{SLDQ_2}$.

Accordingly, it is apparent from FIG. 6 that each active area $AA_1$–$AA_4$ serves as the source region for four bank bit line transistors of a set, and as the drain region for one global bit line transistor. For instance, the bottom portion of active area $AA_1$ comprises the source regions of transistors 59, 61, 63 and 65, whereas the top portion of active area $AA_1$ serves as the drain region for the global bit line transistor 67 coupled to bit line switch set $34_1$. Gate conductor $G_{67}$ separates active area $AA_1$ with the source $S_{67}$ of device 67. Global column select line $GCSL_1$ runs generally perpendicular to the bank column select lines and connects to gate conductor $G_{67}$ via gate contact $GN_6$. $GCSL_1$ also connects to gate conductor $G_{68}$ of device 68 via gate contact $GN_{68}$. The source region $S_{67}$ of device 67 connects to local data line LDQ through source contact $SC_{67}$. Source region $S_{68}$ of device 68 connects through source contact $SC_{68}$ to local data line $\overline{LDQ}$. Likewise, global column select line $GCSL_2$ runs generally perpendicular to the bank column select lines and connects to the gates of the global bit switches 67 and 68 associated with bank switch set $34_2$.

Active area $AA_2$ is shared among bank bit line transistors 60, 62, 64 and 66 and with global bit line transistor 68. As such, active area $AA_2$ encompasses the source regions of devices 60, 62, 64 and 66 and the drain region of device 68. Similarly, active area $AA_3$ encompasses the source regions of transistors 59, 61, 63 and 65 of bit line switch set $34_2$, and active area $AA_4$ encompasses the source regions of devices 60, 62, 64 and 66 of switch set $34_2$. line switches that have their gates coupled together may share a continuous gate conductor. For instance, gates $G_{61}$ and $G_{62}$ are formed as one continuous line, as are gate conductors $G_{65}$ and $G_{66}$. On the other hand, in the exemplary layout, local bit line transistor pairs 59, 60 do not share a continuous gate conductor, but are electrically connected through the bank column select line. The same holds for transistor pairs 63, 64. Bank column select line $BCSL_{1a}$ of FIG. 4 is comprised of an upper line $BCSL_{1u}$ and a lower line $BCSL_{1l}$ as depicted in FIG. 6, where the upper line $BCSL_{1u}$ and lower line $BCSL_{1l}$ are periodically connected at several points along the length of the memory cell array. Likewise, bank column select line $BCSL_{3a}$ of FIG. 4 is comprised of the upper and lower line $BCSL_{3u}$, and $BCSL_{3l}$ of FIG. 6, which are periodically connected. Connection between these upper and lower column select lines is typically realized by an electrical interconnection of each line to a connecting conductor on another vertically spaced layer.

It is understood that the active area sharing concept of the present invention is not limited to the sharing of active areas of five transistors, nor to active area sharing of all the true or complementary bit line switches of each bank bit line switch set. However, diffusion region sharing of at least three transistors of each bank bit line set is preferred in order to achieve compactness in the design and conserve as much space as possible.

Figure 7:
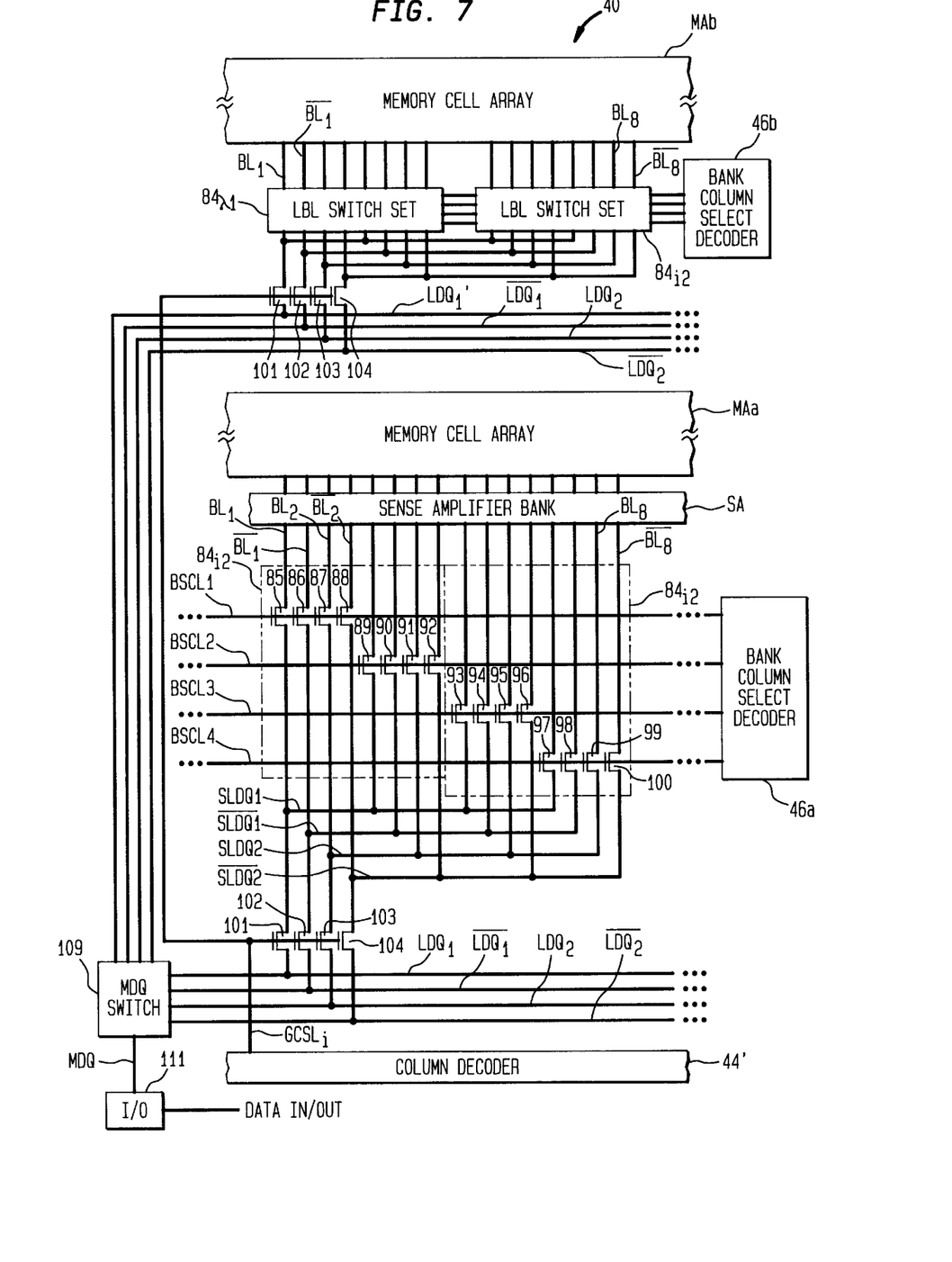
FIG. 7 schematically illustrates an alternative embodiment of the invention.

With reference now to FIG. 7, an alternative embodiment of a DRAM having a hierarchical column select line and local data line architecture is schematically presented. DRAM 40' differs the above-discussed DRAM 40 in that four local data lines are used for each memory cell bank, the bank bit line switches are grouped differently, and a different grouping for the global bit line switches are used. Specifically, each global column select line $GCSL_i$ is coupled to the gates of four global bit line switches 101–104 of each memory cell array such as MAa and MAb. The drains of switches 101, 102, 103 and 104 are coupled to local data lines $LDQ_1$, $\overline{LDQ_1}$, $LDQ_2$ and $\overline{LDQ_2}$, each of which connects to an MDQ switch 109. MDQ switch 109 receives control signals from the row decoder or associated control circuitry to switch a selected LDQ line to a master data line MDQ. The MDQ line is buffered by I/O buffer 111.

Bank bit line switch set $84_{t1}$ is comprised of bank bit line switches 85–88 which have their gates coupled to bank CSL line $BCSL_1$, and bank bit line switches 89–92 which have their gates coupled to line $BCSL_2$. Likewise, bank bit line switch set $84_{t2}$ consists of bank bit line switches 93–96 which have their gates tied to BCSL3, and bank bit line switches 97–100 which have their gates tied to line BCSL4. The bank column select lines for each bank are selectively activated by a bank column select decoder 46a or 46b as was the case for DRAM 40 of FIG. 2.

In the configuration of FIG. 7, since each global column select line $GSCL_i$ controls four global CSL switches, which are in turn coupled to sixteen bank CSL switches, the number of global column select lines is half the number for the configuration of FIG. 2. Hence, column decoder 44', which is modified from decoder 44 of DRAM 40, activates line $GCSL_i$ whenever the column address corresponds to one of the associated sixteen local column select lines.

Operation of DRAM 40' is similar to that described above for DRAM 40. One difference is that MDQ switch 109 switches between eight local data lines as opposed to four as in DRAM 40. Of course, the designs of the bank column select decoders 46a, 46b are modified to activate the correct bank bit line switches corresponding to the column address.

The layout for the bank bit line switches and global bit line switches of DRAM 44' may be similar to that for DRAM 40, preferably with sets of at least four bank bit line switches in proximity to one another sharing diffusion regions (active areas) to conserve space, and with one or more of the global bit line switches sharing diffusion regions with the bank bit line switches.

While the above description contains many specifics, these specifics should not be construed as limitations on the scope of the invention, but merely as exemplifications of preferred embodiments thereof. Those skilled in the art will envision many possible variations that are within the scope of the invention as defined by the appended claims.

What is claimed is:

1. A semiconductor memory, comprising:
   a plurality of memory cell banks, each having a plurality of rows and a plurality of columns, with bit lines running in the respective columns to access memory cells therein;
   a column decoder operative to selectively activate at least one of a plurality of global column select lines in accordance with a column address, each global column select line controlling at least one global bit line switch of a memory cell bank, each global bit line switch coupled to a data line for the associated memory cell bank;
   a plurality of bank bit line switches coupled to each global bit line switch, with each bank bit line switch coupled to a bit line of an associated column;
   said bit lines being selectively activated in accordance with said column address such that a bit line of a particular column is activated when both a global bit line switch and a bank bit line switch associated with that column are activated;
   wherein at least one said bank bit line switch has a shared, common doped region with at least one of another bank bit line switch or a global bit line switch.

2. The semiconductor memory of claim 1, wherein each column includes a true bank bit line switch coupled to a true bit line and a complementary bank bit line switch coupled to a complementary bit line, and at least four bank bit line switches and one global bit line switch have a shared, common doped region.

3. The semiconductor memory of claim 2, wherein at least four bank bit line switches coupled to true bit lines of different columns and one global bit line switch have a shared, common doped region.

4. The semiconductor memory of claim 2 wherein said bank and global bit line switches are field effect transistors and said doped region comprises a source region for said bank bit line switches and a drain region for said global bit line switches.

5. The semiconductor memory of claim 1 wherein said memory comprises a dynamic random access memory.

6. The semiconductor memory of claim 1 wherein the number of bank column select lines for each bank equals N/K, where K is an integer greater than one.

7. The semiconductor memory of claim 1 wherein the bank bit line switches are coupled to respective sense amplifiers each connected to bit lines on both sides of the sense amplifier in a shared configuration, the bit lines arranged in a folded bit line configuration.

8. The semiconductor memory of claim 1 wherein the bank bit line switches are coupled to respective sense amplifiers each connected to bit lines on both sides thereof in an open bit line arrangement.

9. The semiconductor memory of claim 1 wherein:
   bank bit line switches coupled to bit lines of different columns and one global bit line switch have a share, common doped region;
   said shared, common doped region of said bank bit line switches and said one global bit line switch is a centralized shared, common doped region of a larger active area; and
   said global and bank bit line switches each include a gate conductor having an L-shaped portion, such that the gate conductors of the bank bit line switches of different columns and the one global bit line switch separate said centralized region from one of a source or drain region of each respective bank bit line switch and the one global bit line switch.

10. The semiconductor memory of claim 9 wherein four bank bit line switches share said centralized shared, common doped region.

11. The semiconductor memory of claim 9, wherein said bank bit line switches comprise true bank bit line switches and complementary bank bit line switches, said true and complementary bank bit line switches being arranged in bank bit line switch sets such that the true bank bit line switches of a given set are coupled to a true global bit line switch associated with the given set and the complementary bank bit line switches of the given set are coupled to a complementary global bit line switch associated with the given set; and
   the true bank bit line switches of the given set and the associated true global bit line switch share a first said centralized shared, common doped region, and the complementary bank bit line switches of the given set and the associated complementary global bit line switch share a second said centralized shared, common doped region.

12. The semiconductor memory of claim 11 wherein a gate conductor of at least one true bank bit line switch of the given set is shared with a gate conductor of a corresponding complementary bank bit line switch.

13. The semiconductor memory of claim 12 wherein the gate conductor shared between the true bank bit line switch and the complementary bank bit line switch of the given set is U-shaped and extends between the first and second centralized, common doped regions.

14. A semiconductor memory, comprising:
   a plurality of memory cell banks, each having a plurality of rows and a plurality N of columns, with bit lines running in the respective columns to access memory cells therein;
   a column decoder operative to activate one of N/K global column select lines in accordance with a column address, where K is an integer greater than one, each global column select line controlling at least a pair of global bit line switches of a memory cell bank, each global bit line switch coupled to a data line for the associated memory cell bank;
   each memory cell bank including plural bank column select lines, each coupled to bank bit line switches of different columns and controlling switching states thereof, with a set of bank bit line switches being coupled to each global bit line switch;
   a bank column select decoder for each bank, coupled to said bank column select lines, for selectively activating said bank column select lines in accordance with said column address to thereby select, in conjunction with an activated global column select line, a particular column for memory cell access;
   wherein at least two bank bit line switches associated with different columns share a common, doped region.

15. The semiconductor memory of claim 14 wherein four local bit line switches of different columns and at least one global bit line switch have a shared, common doped region.

16. The semiconductor memory of claim 14 wherein the memory comprises a dynamic random access memory.

17. The semiconductor memory of claim 14 wherein each memory cell bank includes folded bit lines.

18. The semiconductor memory of claim 14 wherein each memory cell bank includes open bit lines.

19. A semiconductor memory, comprising:
   a plurality of memory cell banks, each having a plurality of rows and a plurality N of columns, with bit lines running in the respective columns to access memory cells therein;
   a column decoder operative to activate one of N/K global column select lines in accordance with a column address, where K is an integer greater than one, each global column select line controlling at least a pair of global bit lines switches of a memory cell bank, each global bit line switch coupled to a data line for the associated memory cell bank;
   each memory cell bank including plural bank column select lines, each coupled to bank bit line switches of different columns and controlling switching states thereof, with a set of bank bit line switches being coupled to each global bit line switch;
   a bank column select decoder for each bank, coupled to said bank column select lines, for selectively activating said bank column select lines in accordance with said column address to thereby select, in conjunction with an activated global column select line, a particular column for memory cell access;
   wherein:
   bank bit line switches coupled to bit lines of different columns and an associated global bit line switch have a shared, common doped region;
   said shared, common doped region of said bank bit line switches and said associated global bit line switch is a centralized shared, common doped region of a larger active area; and,
   said global and bank bit line switches each include a gate conductor having an L-shaped portion, such that the gate conductors of the bank bit line switches of different columns and the associated global bit line switch separate said centralized region from one of a source or drain region of each respective bank bit line switch and the associated global bit line switch.

20. The semiconductor memory of claim 19, wherein said bank bit line switches comprise true bank bit line switches and complementary bank bit line switches, said true and complementary bank bit line switches being arranged in bank bit line switch sets such that the true bank bit line switches of a given set are coupled to a true global bit line switch associated with the given set and the complementary bank bit line switches of the given set are coupled to a complementary global bit line switch associated with the given set;

the true bank bit line switches of the given set and the associated true global bit line switch share a first said centralized shared, common doped region, and the complementary bank bit line switches of the given set and the associated complementary global bit line switch share a second said centralized shared, common doped region;

wherein a gate conductor for at least one true bank bit line switch of the given set is shared with a gate conductor of a corresponding complementary bank bit line switch.

\* \* \* \* \*